(12) United States Patent
Yamane et al.

(10) Patent No.: US 6,826,494 B2
(45) Date of Patent: Nov. 30, 2004

(54) PSUEDO NOISE GENERATOR

(75) Inventors: Koji Yamane, Sendai (JP); Takashi Shinozuka, Koganei (JP); Kaoru Setoguchi, Chofu (JP)

(73) Assignees: IWATSU Electric Co., Ltd., Tokyo (JP); Electromagnetic Compatibility Research Laboratories Co., Ltd., Sendai (JP)

( * ) Notice: Subject to any disclaimer, the term of this patent is extended or adjusted under 35 U.S.C. 154(b) by 0 days.

(21) Appl. No.: 10/626,111

(22) Filed: Jul. 24, 2003

(65) Prior Publication Data

US 2004/0167737 A1 Aug. 26, 2004

Related U.S. Application Data

(63) Continuation of application No. 09/604,896, filed on Jun. 28, 2000, now abandoned.

(30) Foreign Application Priority Data

Aug. 31, 1999 (JP) .......................................... 11-245183

(51) Int. Cl.[7] .............................................. G06F 7/58
(52) U.S. Cl. ...................................... 702/69; 708/250
(58) Field of Search ............................... 702/66–67, 69, 702/179–181, 189–191; 714/738–741, 728; 375/227, 367; 708/250–256

(56) References Cited

U.S. PATENT DOCUMENTS

| | | | | |
|---|---|---|---|---|
| 4,308,617 A | * | 12/1981 | German, Jr. ................. | 375/146 |
| 4,375,620 A | * | 3/1983 | Singer et al. ................. | 331/78 |
| 4,470,022 A | * | 9/1984 | Cernius et al. ............... | 331/78 |
| 4,617,530 A | * | 10/1986 | Young .......................... | 331/78 |
| 4,759,034 A | * | 7/1988 | Nagazumi .................... | 375/142 |
| 4,835,790 A | * | 5/1989 | Yoshida et al. ............... | 375/227 |
| 5,153,532 A | * | 10/1992 | Albers et al. ................. | 331/78 |
| 5,357,551 A | * | 10/1994 | Bolk et al. .................... | 378/98 |
| 5,786,951 A | * | 7/1998 | Welland et al. ............... | 360/46 |
| 5,822,332 A | * | 10/1998 | Nagai .......................... | 714/707 |
| 5,923,193 A | * | 7/1999 | Bloch et al. ................. | 327/141 |

* cited by examiner

Primary Examiner—Marc S. Hoff
Assistant Examiner—Mary Catherine Baran
(74) Attorney, Agent, or Firm—Myron Greenspan; Lackenbach Siegel, LLP

(57) ABSTRACT

A pseudo noise generator includes a first arbitrary random number generator that generates two groups of first random number signals respectively corresponding to pre-divided Amplitude Probability Distributions, which are obtained by pre-dividing a specified Amplitude Probability Distribution into two parts at a specified level. A second arbitrary random number generator generates two groups of second random number signals respectively defined by a specified Pulse Duration Distribution and a specified Pulse Spacing Distribution at said specified level. One of the two groups of first random number signals are selected in accordance with the specified Pulse Duration Distribution and the specified Pulse Spacing Distribution defined at said specified level. The selected signals are converted, by a D/A converter, to pseudo noise of analog value in accordance with the Amplitude Probability Distribution, the specified Pulse Duration Distribution and the specified Pulse Spacing Distribution at the specified level.

7 Claims, 13 Drawing Sheets

ARBITRARY DISTRIBUTION RANDOM NUMBER GENERATOR 1

Fig. 5

| MEMORY OF 1-BIT GEN. | |
|---|---|
| ADDRESS s | DATA y pc |
| 0 | pc₂(1,0) |
| 1 | pc₁(1,0) |

| MEMORY OF 2-ND GEN. | |
|---|---|
| ADDRESS s,a | DATA y pc |
| 0,0 | pc₂(2,0) |
| 0,1 | pc₂(2,1) |
| 1,0 | pc₁(2,0) |
| 1,1 | pc₁(2,1) |

| MEMORY OF 8-TH GEN. | |
|---|---|
| ADDRESS s,a,b,...h | DATA y pc |
| 0,0,...,0 | pc₂(8,0) |
| 0,0,...,1 | pc₂(8,1) |
| ... | ... |
| ... | ... |
| 0,1,...,1 | pc₂(8,127) |
| 1,0,...,0 | pc₁(8,0) |
| ... | ... |
| ... | ... |
| 1,1,...,0 | pc₁(8,126) |
| 1,1,...,1 | pc₁(8,127) |

(a) APD (b) CRD (c) PDF

PDD

Fig. 1 1
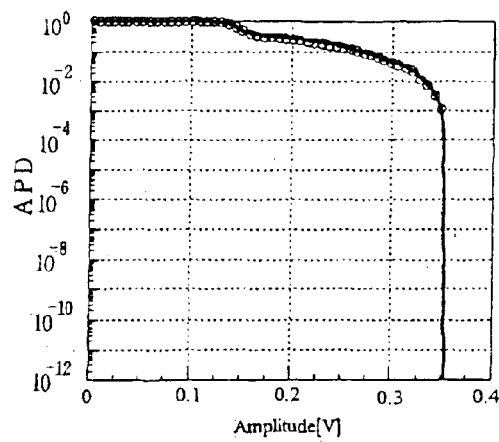
(a)
APD
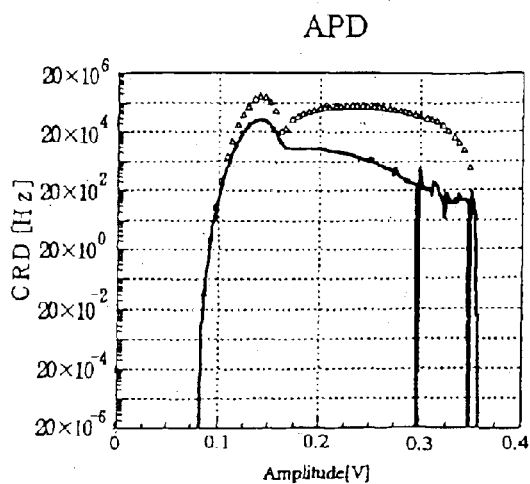
(b)
CRD
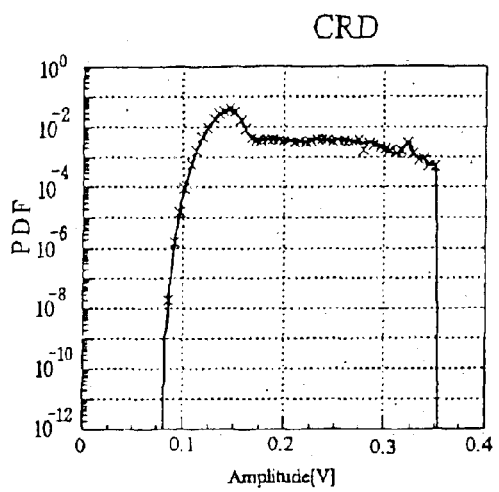
(c)
PDF

Fig. 12
(a)
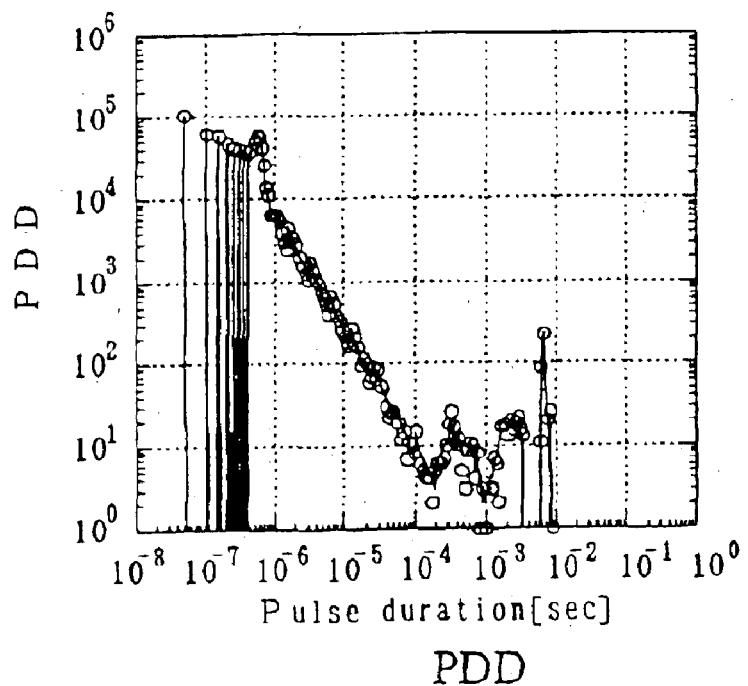
PDD
(b)
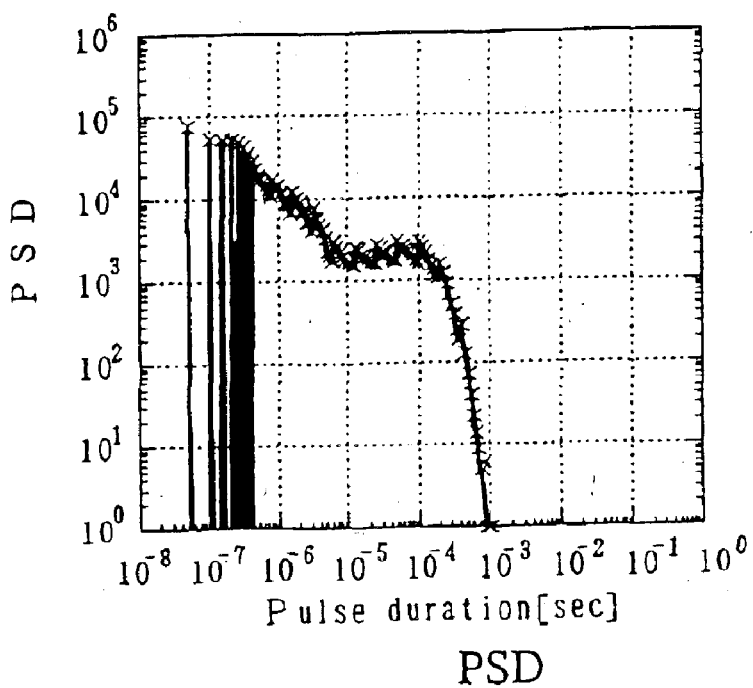
PSD

PSUEDO NOISE GENERATOR

This application is a continuation of application Ser. No. 09/604,896, filed Jun. 28, 2000 now abandoned, which further claims priority benefit of JP App. No. 245183/99 filed Aug. 31, 1999, the contents of which are both herein incorporated fully by reference.

BACKGROUND OF THE INVENTION

1. Field of the Invention

The present invention relates to a pseudo noise generator employed to generate pseudo noise, etc., for evaluating the immunity of electric devices to electro-magnetic interference waves.

2. Description of the Prior Art

When many kinds of electrical or thermal or city noise combine with one another, the amplitude of the noise has a Gaussian distribution. In order to make generated noises simulate the Gaussian distribution, there has been proposed a noise generator for generating white-Gaussian noise by the use of a noise diode.

In narrow-band digital communication systems, there is a correlation between a bit error rate of the narrow-band digital communication system and an Amplitude Probability Distribution (referred to as the "APD") of the electro-magnetic interference waves. Moreover, a report was published that the bit error rate of a communication system can be evaluated from the APD of the electro-magnetic interference waves. In this report, noise determined by a specified APD is generated by the use of an arbitrary distribution random number generator (*Paper Journal of the Institute of Electrical Communication Engineers of Japan* (A), vol. J 70-A, No. 11, pp. 1681–1690, Nov. 1987).

Important parameters for defining the characteristic nature of noise are the APD, a Crossing Rate Distribution (referred to as a CRD), a Pulse Duration Distribution (referred to as a PDD), and a Pulse Spacing Distribution (referred to as a PSD), etc. These parameters will now be described with reference to FIG. 13.

The APD is defined as a time rate where the instantaneous value of a signal, such as electro-magnetic interference waves, exceeds a predetermined value, to show a total time length of the instantaneous value exceeding a level $E_k$ in a test time period $T_0$. The CRD is defined as the number of crossing per unit time where to instantaneous value of the signal crosses the specified level $E_k$ in a positive direction (or a negative direction).

The PDD is defined as a probability distribution of the time $W_t(k)$ where the instantaneous value of the signal exceeds a level $E_K$ in a test time period of $T_0$. In contrast, the PSD is defined as a probability distribution of a time $Z_j(k)$ where the instantaneous value of the signal lowers a level $E_K$ in a test time period of $T_0$. In other words, the PDD and the PSD are probability distributions of time lengths from a time where the instantaneous value of the signal crosses the threshold value to a just succeeding time where the instantaneous value of the signal crosses the threshold value.

Moreover, a Probability Density Function is defined as a distribution of the level $E_K$ in the test time period $T_0$.

In a pseudo noise generator, the dispersion and the average of noise can be specified, but the APD of noise cannot be specified since the distribution of noise is limited to white-Gaussian noise.

In an arbitrary distribution random generator, the APD of noise is specified to generate noise with an arbitrary APD. However, noise from the arbitrary distribution random generator assumes independent events having no time-correlation. On the contrary, noise from electronic ranges and ordinary electronic devices assumes non-independent events dependent on the period of a source voltage and the period of timing clock pulses. Accordingly, the CRD, the PDD and the PSD of noise from the arbitrary distribution random generator are different from the CRD, the PDD and the PSD of noise of non-independent events having time-correlation.

SUMMARY OF THE INVENTION

An object of the present invention is to provide a pseudo noise, generator capable of specifying and Pulse Duration Distribution and a Pulse Spacing Distribution of noise at a specified amplitude level K in addition to an Amplitude Probability Distribution of noise.

To this end, a pseudo noise generator of the present invention comprises:

a first arbitrary random number generator for generating two groups of first random number signals respectively corresponding to, pre-divided Amplitude Probability Distributions, which are obtained by pre-dividing a specified Amplitude Probability Distributions into two parts at a specified level:

a second arbitrary random number generator for generating two groups of second random number signals respectively defined by a specified Pulse Duration Distribution and a specified Pulse Spacing Distribution at the specified level;

control means for selecting one of said two groups of first random number signals in accordance with said specified Pulse Duration Distribution and said specified Pulse Spacing Distribution and said specified Pulse Spacing Distribution at the specified level.

BRIEF DESCRIPTION OF THE DRAWINGS

The present invention be will be described in detail below with reference to the accompanying drawings, in which:

FIG. 5 is a graph showing an arrangement of data in the memory of the bit generator;

FIG. 11 shows characteristic curves illustrating the present invention's test results of the Amplitude Probability Distribution (a), the Crossing Rate Distribution (b) and the Probability Density Function (c) of electro-magnetic interference waves from electronic Ranges and pseudo noise in case of specifying the electro-magnetic interference waves from electronic Ranges and the Amplitude Probability Distribution;

FIG. 12 shows characteristic curves illustrating the present invention's test results of the Pulse Duration Distribution (a) and the Pulse Spacing Distribution (b) of electro-magnetic interference waves from electronic Ranges and pseudo noise as to specifying the electro-magnetic interference waves from electronic Ranges and the Amplitude Probability Distribution.

DETAILED DESCRIPTION OF THE PREFERRED EMBODIMENTS

Figure 1:
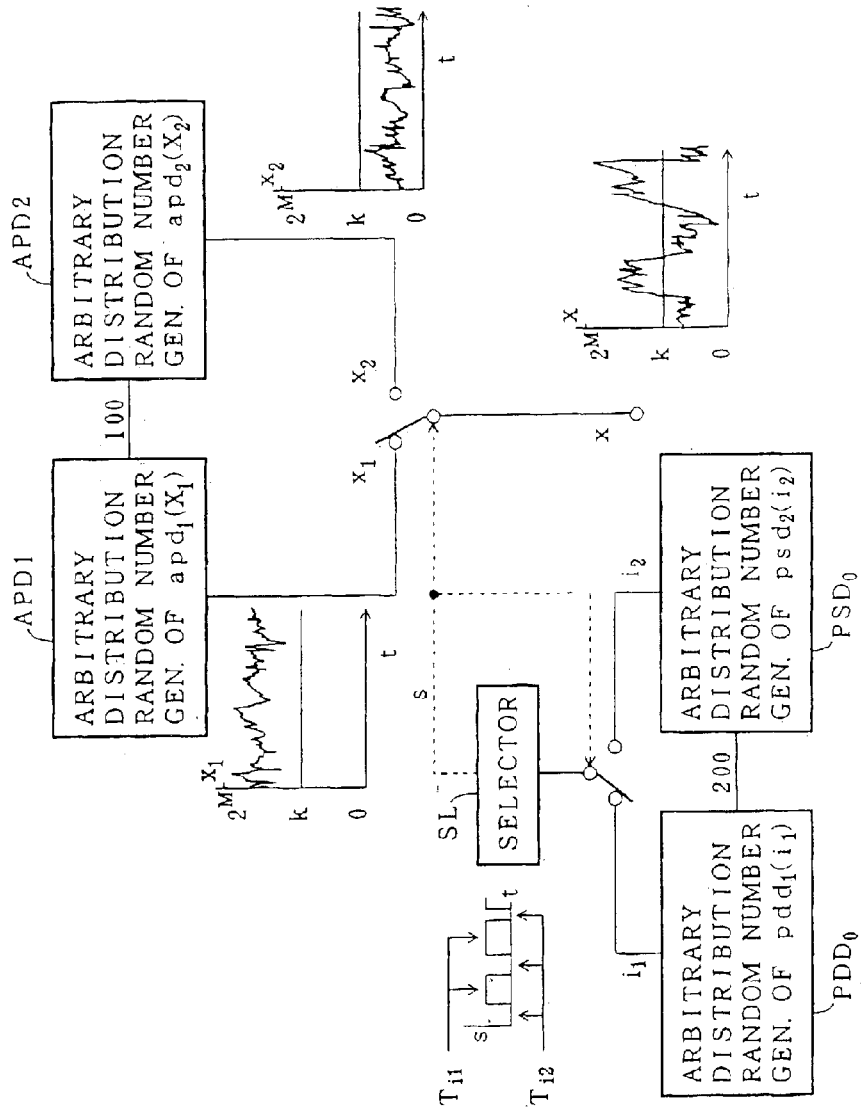
FIG. 1 is a block diagram that clarifies the principle of the present invention.

With reference to FIG. 1, the principle of the pseudo noise generator of the present invention, in accordance with a specified APD, a specified PDD and a specified PSD, will first be described. This pseudo noise generator comprises four arbitrary distribution random number generators $APD_1$, $APD_2$, $PDD_0$ and $PSD_0$, and a selector SL.

In this embodiment, the settings for the PDD and the PSD are the one point of the same level k; there is provided an arbitrary distribution random number generator $APD_1$ for generating random numbers of values that exceed the level k and an arbitrary distribution random number generator $APD_2$ for generating random numbers of values under the level k. These arbitrary distribution random number generators $APD_1$ and $APD_2$ are switched to meet with the specified PDD and PSD to generate random number codes meeting with required APD, PDD and PSD. In other words, the generation of pseudo noise according to the present invention is performed as described below:

(1) Binary codes $i_1$ of N bits included in a pulse duration distribution pdd ($i_1$) are generated from the arbitrary distribution random number generator $PDD_0$ to determine a pulse duration length $T_{i1}$. During this pulse duration $T_{i1}$, binary codes $x_1$ of M bits each, included in an amplitude probability distribution $apd_1(x_1)$ are generated from the arbitrary distribution random number generator $APD_1$ to obtained pseudo noise x.

(2) After the end of the pulse direction $T_{i1}$, binary codes $i_2$ of N bits, included in a pulse duration distribution $psd(i_2)$, are generated from the arbitrary distribution random number generator $PSD_0$ to determine a pulse duration length $T_{i2}$. During this pulse duration length $T_{i2}$, binary codes $x_2$ of M bits included in an amplitude probability distribution $apd_2(x_2)$ are generated from the arbitrary distribution random number generator $APD_2$ to obtain an output of pseudo noise x.

(3) The above steps (1) and (2) are alternately performed.

In accordance with the above operations, binary numbers x of M bits meeting with the required APD in addition to the required PDD and PSD are generated, and digital-to-analog converted to obtain an output of the pseudo noise generator.

As mentioned above, in the pseudo noise generator of the present invention an arbitary distribution random number generator 100 for generating exclusively the binary codes $x_1$ of M bits included in an amplitude probability distribution $apd_1(x_1)$ or the binary codes $x_2$ of M bits included in an amplitude probability distribution $apd_2(x_2)$ is employed in place of an arbitrary distribution random number generator for generating a signal x included in a specific amplitude probability distribution (x).

A controller for outputting a memory selecting signal s is provided to select a first state generating the binary codes $x_1$ or a second state generating the binary codes $x_2$.

An arbitrary distribution random number generator 200 is provided for generating exclusively the binary codes $i_1$ of M bits included in a pulse duration distribution $pdd_1(i_1)$ or the binary codes $i_2$ of M bits included in a pulse spacing distribution $psd(i_2)$ to generate the memory selection signal s employed in the controller. The $pdd_1(i_1)$ and the $psd(i_2)$ are set at one point of the same level k.

A digital-analog converter is provided to convert the binary codes x ($x_1$ or $x_2$) to an analog value. An analog signal converted in the digital-analog converter is applied to a communication system through a cable or is radiated from an antenna by shifting the frequency band thereof by the use of an up-converter.

In the pseudo noise generator according to the present invention, the binary codes it included in the pulse duration distribution $pdd_1(i_1)$ are generated from the arbitrary distribution random number generator 200. During the pulse duration length $T_{i1}$ corresponding to the binary codes $i_1$, the binary codes $x_1$ included in an amplitude probability distribution $apd_1(x_1)$ are generated from the arbitrary distribution random number generator 100. Thereafter, the binary codes $i_2$ included in a pulse spacing distribution $psd(i_2)$ are generated from an arbitrary distribution random generator 200. During the pulse duration length $T_{i2}$, the binary codes $x_2$ included in an amplitude probability distribution $apd_2(x_2)$ are generated from the arbitrary distribution random number generator 100. The switching between the amplitude probability $apd_1(x_1)$ and the amplitude probability distribution $apd_2(x_2)$, and the switching between the pulse duration distribution $pdd_1(i_1)$ and the pulse spacing distribution psd ($i_2$), are performed in accordance with the memory selection signal s from the selector SL.

Since the amplitude level of the binary codes $x_1$ included in the amplitude probability distribution $apd_1(x_1)$ exceeds the value k while the amplitude level of the binary codes $x_2$ included in the amplitude probability distribution $apd_2(x_2)$ lowers the value k the PDD and the PSD are set at the amplitude k during the pulse duration length $T_{i1}$ and the pulse duration length $T_{i2}$, respectively.

The amplitude probability distribution $apd_1(x_1)$ and the amplitude probability distribution $apd_2(x_2)$ are calculated from the amplitude probability distribution $apd(x)$. If the amplitude probability distribution $apd(k)$, the pulse duration distribution $pdd_1(i_1)$ and the pulse spacing distribution psd ($i_2$) meet the conditions defined by equation (1), the binary codes $x(x_1$ or $x_2)$ generated from the arbitrary distribution random number generator 100 are included in the amplitude probability distribution $apd(x)$. Here, the notation M is the number of bits of the binary codes x ($x_1$ or $x_2$) generated from the arbitrary distribution random number generator 100, and the notation N is the number of bits of the binary codes i($i_1$ or $i_2$).

$$\sum_{i_2=0}^{2^N-1} psd(i_2)T_{i2} = \frac{1-apd(k)}{apd(k)} \sum_{i_1=0}^{2^N-1} psd(i_1)T_{i1} \quad (1)$$

In the present invention, the designation of the pulse duration distribution PDD and the pulse spacing distribution PSD is not limited to a designation of distribution having a distribution duration, but can also be an included designation of a special example of distribution having a defined value, as far as this meets the condition of equation (1).

Figure 2:
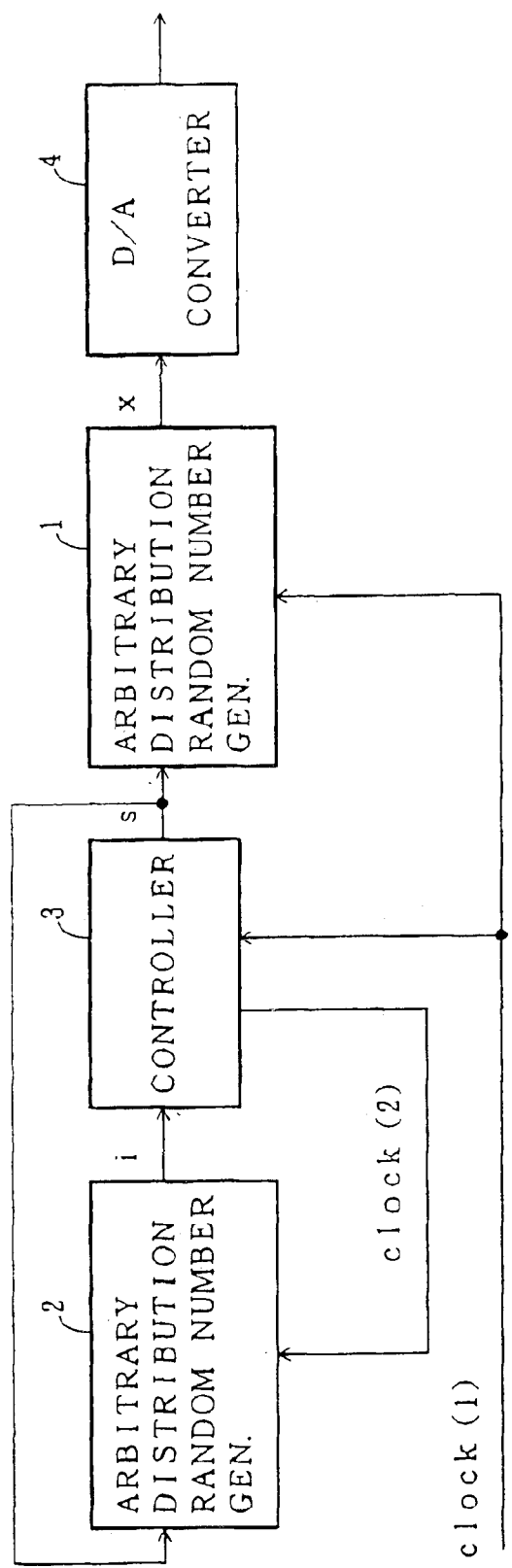
FIG. 2 is a block diagram illustrating an embodiment of the present invention.

In FIG. 2, an embodiment of the pseudo noise generator of the present invention is illustrated. In this embodiment, arbitrary distribution random number generators of eight bits are employed. The embodiments comprises an arbitrary distribution random number generator 1, an arbitrary distribution random number generator 2, a controller 3 and a digital-to-analog (D/A) converter 4. The arbitrary distribution random number generator 1 is controlled by clock (1) and the memory selection signal s from the controller 3. The arbitrary distribution random number generator 2 is controlled by clock (2) and the memory selection signal s, which are both applied from the controller 3. The D/A converter 4 converts the binary codes x to an analog signal.

Figure 3:
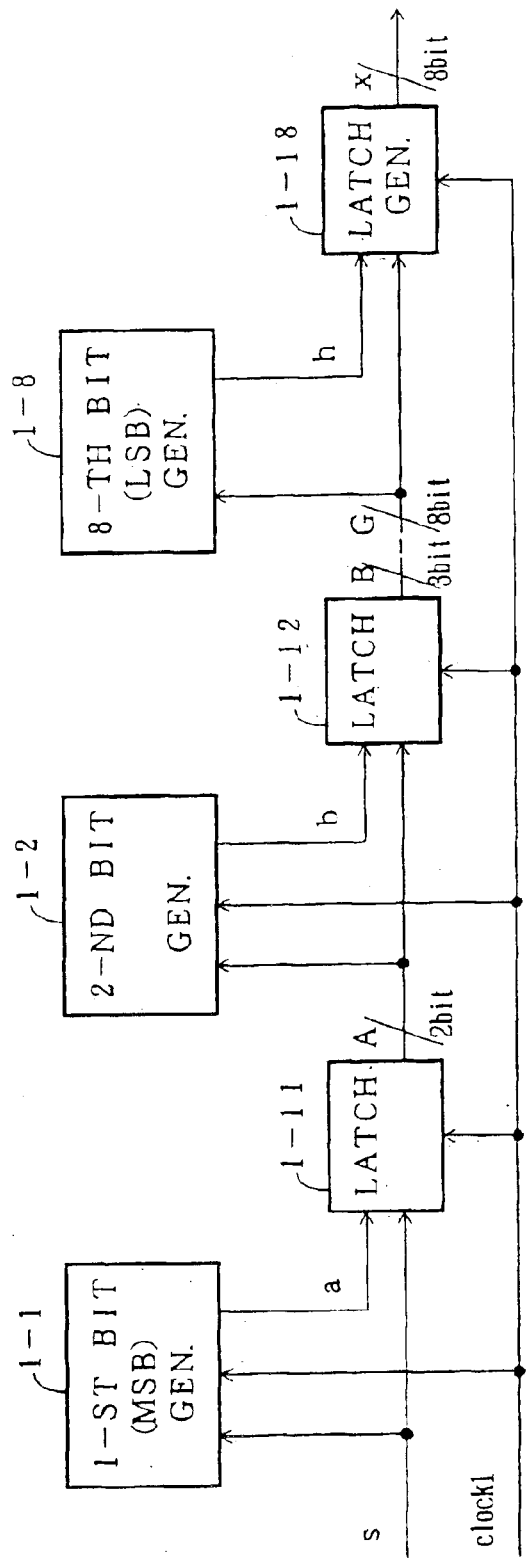
FIG. 3 is a block diagram illustrating an example of an arbitrary distribution random number generator 1.

With reference to FIG. 3, the arbitrary distribution random number generator 1 comprises eight bit generators 1-1 to 1-8 and eight latch circuits 1-11 to 1-18 to generate the binary codes $x(x_1$ or $x_2)$ of eight bits, in which the eight bit generators 1-1 to 1-8 and eight latch circuits 1-11 to 1-18 are alternately connected in cascade so as to actuate each of the bit generators 1-1 to 1-8 at the rising instants of each clock pulses.

Figure 4:
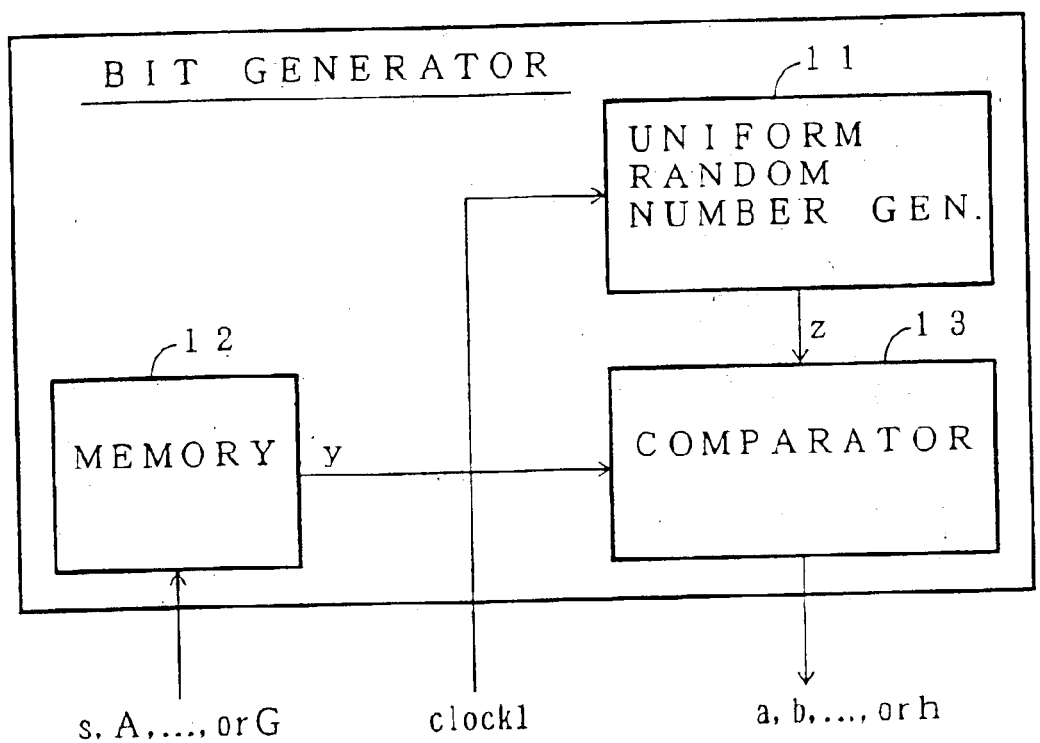
FIG. 4 is a block diagram illustrating an example of each bit generator employed in arbitrary distribution random number generators 1 and 2.

As shown in FIG. 4, each of the eight bit generators 1-1 to 1-8 comprises a uniform random number generator 11, a memory 12, and a comparator 13. In the memory 12, data y employed for determining each bit (a, b, . . . , h) of the binary codes x ($x_1$ or $x_2$) are stored as follows.

The amplitude probability distribution $apd_1(x_1)$ corresponds to a limited part of the binary codes $x(x_1)$ in the amplitude probability distribution $apd(x)$ to generate the binary code $x_1$, which is included in a range $k \leq x$. The amplitude probability distribution $apd_1(x_1)$ is defined in equation (2).

$$apd_1(x_1) = \begin{cases} 1 & (0 \leq x_1 < k) \\ \dfrac{apd(x_1)}{apd(k)} & (k \leq x_1 \leq 2^8 - 1) \end{cases} \quad (2)$$

The amplitude probability distribution $apd_2(x_2)$ corresponds to a limited part of the binary codes $x$ ($x_2$) in the amplitude probability distribution $apd(x)$ to generate the binary code $x_2$, which is included in a range $k > x$. The amplitude probability distribution $apd_2(x_2)$ is defined in equation (3).

$$apd_2(x_2) = \begin{cases} \dfrac{apd(x_2) - apd(k)}{apd(0) - apd(k)} & (0 \leq x_2 < k) \\ 0 & (k \leq x_2 \leq 2^8 - 1) \end{cases} \quad (3)$$

The amplitude probability distribution $apd_1(x_1)$ and the amplitude probability distribution $apd_2(x_2)$, calculated in accordance with the steps defined in equations (2) and (3) are converted to Conditional Probabilities $pc_1(j, r)$, $pc_2(j, r)$, and then stored as data y for determining each bit in the memory 5 as shown in FIG. 5. Here, the notation j=1, 2, . . . , 8 and the notation r=0, 1, . . . , $2^{j-1}-1$.

$$pc_1(j, r) = \frac{apd_1((2r+1) \times 2^{M-j}) - apd_1((2r+2) \times 2^{M-j})}{apd_1(2r \times 2^{M-j}) - apd_1((2r+2) \times 2^{M-j})} \quad (4)$$

$$pc_2(j, r) = \frac{apd_2((2r+1) \times 2^{M-j}) - apd_2((2r+2) \times 2^{M-j})}{apd_2(2r \times 2^{M-j}) - apd_2((2r+2) \times 2^{M-j})} \quad (5)$$

Now with reference to FIGS. 6 and 4, the operation of the arbitrary distribution random number generator 1 will be described.

In the arbitrary distribution random number generator 1, bit data $A(s_1, a_1)$ from a first bit generator 1-1 is applied through a latch 1-11 to a second bit generator 1-2 at the rising instant of each pulse of the clock (1). The signal $s_1$ is the memory selection signal s, and the signal $a_1$, is a first bit a of the binary codes x from the first bit generator 1-1.

At the same instant that each pulse of the clock (1) rises, the uniform random number generator 11 in the second bit generator 1-2 having the construction shown in FIG. 4 generates uniform random numbers z. Thereafter, the data y employed in the second bit generator 1-2 are read out from the memory 12 by the use of the bit data $A(s_1, a_1)$ as address data. The data y and z are compared with each other, so that a second bit $b_1$ of an arbitrary distribution number x at the output of the comparator 12 assumes a state "1" in the case of y<z, while the second bit $b_1$ assumes the state "0" in the case of y≧z.

The second bit generator 1-2 applies bit data B ($s_1, a_1, b_1$) to a third bit generator 1-3 (not shown) at the just succeeding rising instant of each pulse of the clock (1). New bit data of ($s_2, a_2$) are applied from the first bit generator 1-1 to the second bit generator 1-2, which generates second bit data $b_2$ at the just succeeding clock pulse in response to the bit data of ($s_2, a_2$).

Each of the other bit generators generates corresponding bit data from the, bit data applied from a bit generator of the just preceding stage, so that the bit data applied from the bit generator of the just preceding stage are combined with bit data generated at the bit generator of the instant stage, the combined bit data are applied to a bit generator of the just succeeding state.

Figure 6:
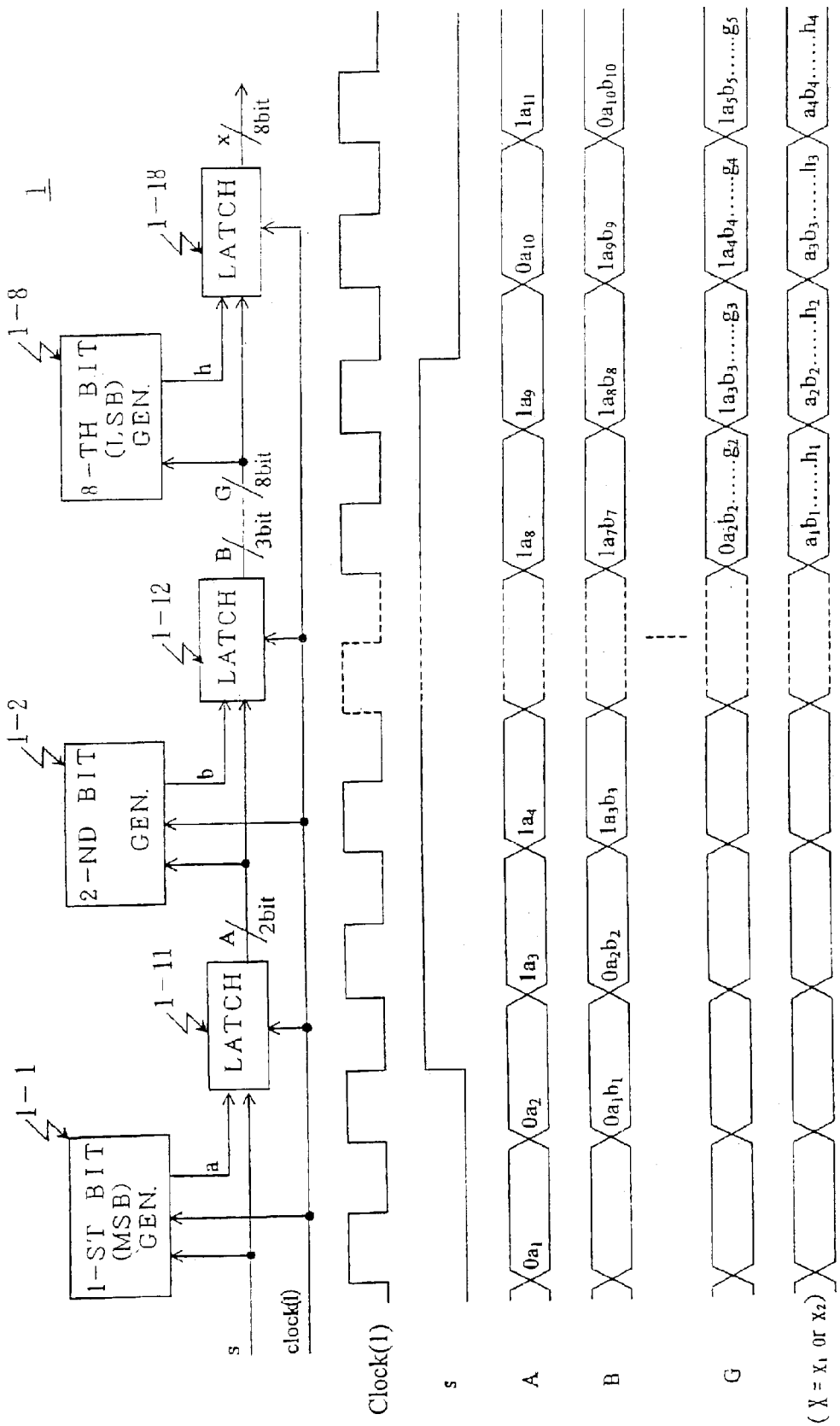
FIG. 6 is a block diagram illustrating an example of the arbitrary distribution random number generator 1 and time charts clarifying the operations of the same.

Here, since the first bit generator 1-1 is in the first stage, only the memory selection signal s is applied to the first bit generator 1-1 as shown in FIG. 6 in the place of the bit data to be applied from a just preceding stage. Since the bit generator 1-8 is in the last stage, the memory selection signal s is not necessarily applied to the next stage. Accordingly, data x (x=a, b, . . . , h) from which the memory selection signal s is removed, are applied to the D/A converter as shown in FIG. 6.

In accordance with the operations mentioned above, the arbitrary distribution random number generator 1 generates the binary code $x_1$ included in the amplitude probability distribution $apd_1(x_1)$ in synchrony with the pulse of the clock (1) when the memory selection signal s from the controller 3 is at "1", the binary code $x_2$ included in the amplitude probability distribution $apd_2(x_2)$ in synchrony with the pulse of the clock (1).

Figure 7:
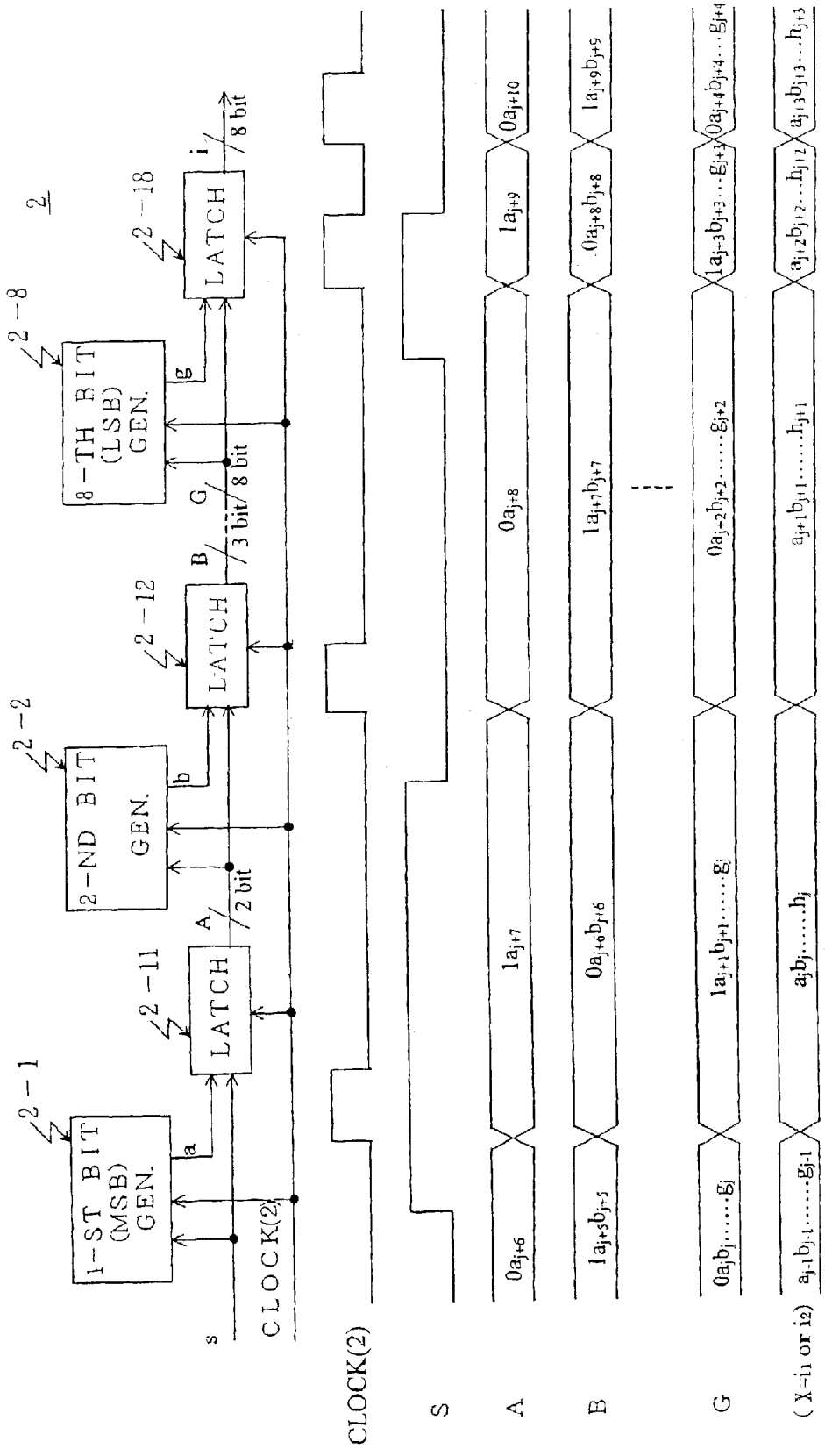
FIG. 7 is a block diagram illustrating an example of the arbitrary distribution random number generator 2 and time charts clarifying the operations of the same.

With reference to FIG. 7, the construction and operation of the arbitrary distribution random number generator 2 will now be described. This arbitrary distribution random number generator 2 generates, alternately, the binary codes $i_1$ employed for determining the pulse duration time length $T_{i1}$ of the binary codes $x_1$ included in the amplitude probability distribution $apd_1(x_1)$, or the binary codes $i_2$ employed for determining the pulse duration length $T_{j2}$ of the binary codes $x_2$ included in the amplitude probability distribution $apd_2(x_2)$.

This arbitrary distribution random number generator 1 is in construction and operation similar to the arbitrary distribution random number generator 2. In the latter, however, the clock (2) is employed in place of the clock (1). In each memory 12 of bit generators 2-1 to 2-8, data for generating the pulse duration distribution $pdd_1(i_1)$ and the pulse spacing distribution $psd(i_2)$ stands in place of the amplitude probability distribution $apd_1(x_1)$ and the amplitude probability distribution $apd_2(x_2)$. From the function $n(T_{i1})$ of a number n and the pulse duration length $T_{i1}$, the pulse duration distribution $pdd_1(i_1)$ can be calculated in accordance with the equation (6).

$$pdd(i_1) = \frac{n(T_{i1})}{\Sigma n(T_{i1})} \quad (6)$$

The pulse spacing distribution $psd(i_2)$ is calculated in a manner similar to the pulse duration distribution $pdd1(i_1)$ in accordance with equation (7).

$$psd(i_2) = \frac{m(T_{i2})}{\Sigma m(T_{i2})} \quad (7)$$

The pulse spacing distribution $psd(i_2)$ and the pulse duration distribution $pdd_1(i_1)$ are converted in accordance with equations (8) and (9) to trial conditional probability values $pc_1(j, r)$ and $pc_2(j, r)$, which are stored in the memory of the arbitrary distribution random number generator 2. Here, the binary codes $i_1$ and $i_2$ are defined by bit signals j and r in equation (8). However, the bit signals j and r are defined as j=1, 2, . . . , 8 and r=0; 1, . . . , $2^{j-1}-1$. The bit signal r is determined by trial results until the (j−1)th trial. The data arrangement in the memory 12 of each bit generation 2-1 to 2-8 is shown in FIG. 5 in a manner similar to the arbitrary distribution random number generator 1:

$$pc_1(j, r) = \frac{pdd((2r+1) \times 2^{8-j}) - pdd((2r+2) \times 2^{8-j})}{pdd(2r \times 2^{8-j}) - pdd((2r+2) \times 2^{8-j})} \quad (8)$$

$$pc_2(j, k) = \frac{psd((2r+1) \times 2^{8-j}) - psd((2r+2) \times 2^{8-j})}{psd(2r \times 2^{8-j}) - psd((2r+2) \times 2^{8-j})} \quad (9)$$

Figure 8:
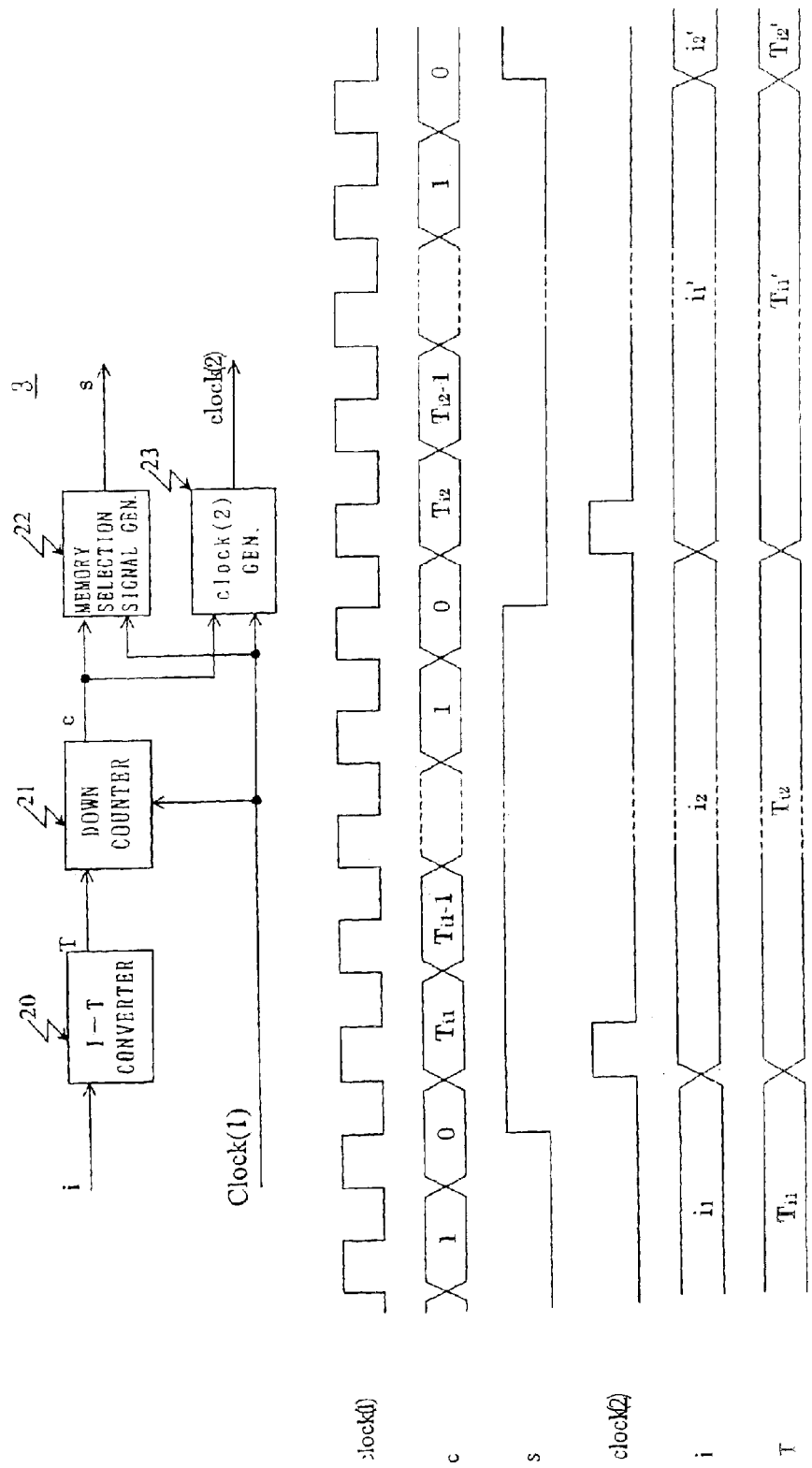
FIG. 8 is a block diagram illustrating an example of the controller 3 and the time charts clarifying the operations of the same.
Figure 9:
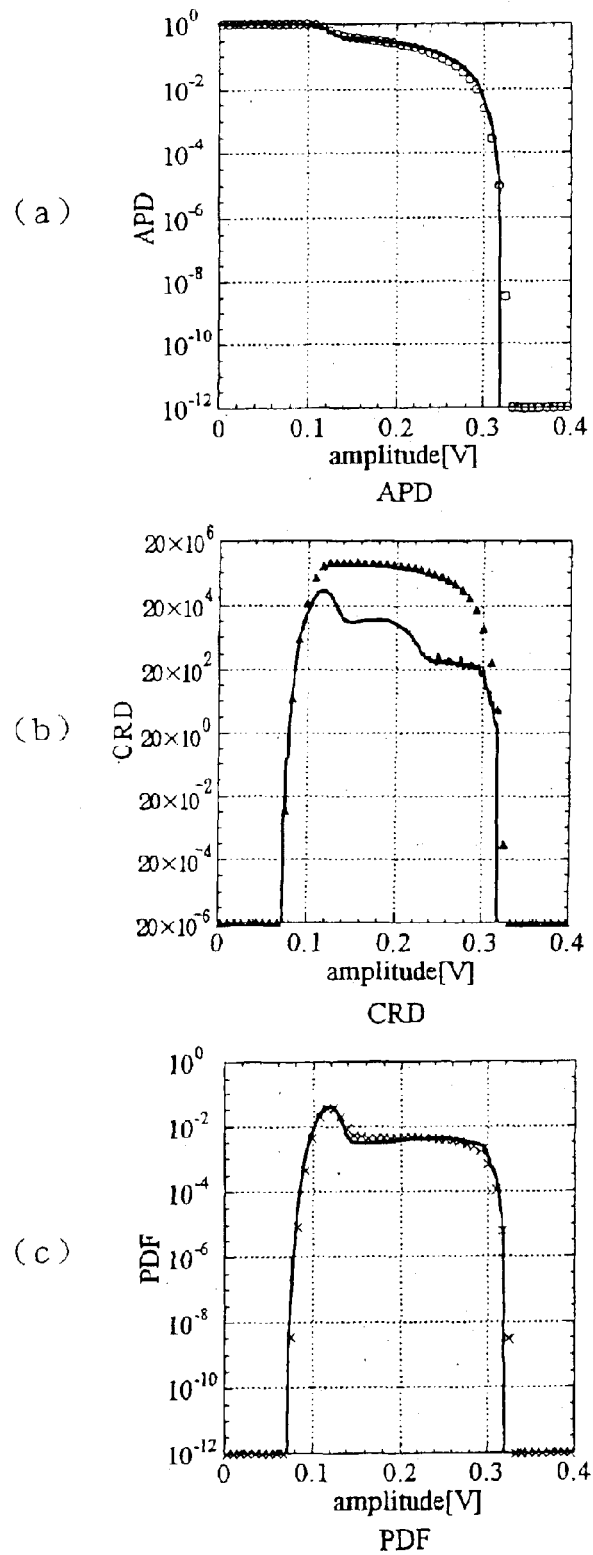
FIG. 9 shows characteristic curves illustrating convention test results of the Amplitude Probability Distribution (a), the Crossing Rate Distribution (b) and the Probability Density Function (c) of electro-magnetic interference waves from electronic Ranges and pseudo noise as to specifying the electro-magnetic interference waves from electronic Ranges and the Amplitude Probability Distribution.

With reference to FIG. 8, the controller comprises an I-T converter 20 receiving the binary codes i, a down counter 21 of 32 bits receiving output data T* of the I-T converter 20 under the control of the clock (I), a memory selection signal generator 22 receiving the carry output c of the down counter 21, and a clock generator 23 receiving the carry output c of the down counter 21 and the clock (I). The I-T converter 20 provides the memory for data of thirty-two bits and is controlled with address codes i(=$i_1$ or $i_2$) of eight address bits to read out the stored data T*(.=$i_1$ or $i_2$).

The controller 3 sets the memory selection signal s to "1" during the time length $I_{i1}$ and "0" during the time length $T_{i2}$ to control the pulse duration length $T_{j1}$ of an arbitrary distribution random number included in the amplitude probability distribution $apd_1(x_1)$ and the pulse duration length $T_{j2}$ of an arbitrary distribution random number included in the amplitude probability distribution $apd_2(x_2)$ as shown in the time charts of FIG. 8.

If the memory selection signal s becomes equal to "1", the counting value c of the down counter 21 is decreased by "1". During this period of the state "1", the arbitrary distribution random number generator 1 generates the amplitude probability distribution $apd_1(x_1)$.

When the counting value c of the down counter 21 reaches the zero state, the memory selection signal s assumes the state "0". During this period of the state "0" the arbitrary distribution random number generator 1 generates the amplitude probability distribution $apd_2(x_2)$.

In response to the zero state of the down counter 21, the pulse duration length $T_{j2}$ is newly set in the down counter 21 at the rising instant of a just succeeding pulse of the clock (1). Simultaneously with the zero state of the down counter 21, a pulse $p_2$ of the clock (2) comes at the rising instant of a just succeeding pulse of the clock (1) to actuate the arbitrary distribution random number generator 2 so as to newly generate the binary code $i_{i1}$, which is converted to the output data $T_1$ in the I-T converter 20.

The controller 3 successively decreases the counting value of the down counter 21 in a manner similar to the state "1" and the memory selection signal s. During this period, the arbitrary distribution random number generator 1 generates the binary code $x_2$ included in the amplitude probability distribution $apd_2(x_2)$. When the counting value of the down counter 21 reaches the zero state, the state "0" of the memory selection signal s is reversed to the state "1", so that the output data $T_1$ is set to the down counter 21 to be restored to its initial state.

As mentioned above, the pulse duration length $T_{j1}$ and the pulse duration length $Tj_2$ are alternately set to the down counter 21 in the controller 3 to alternately reverse the state "1" and the state "0" of the memory selection signal s in response to the pulse duration length $T_{j1}$ and the pulse duration length $T_{j2}$, respectively, so that the binary code $x_2$ included in the amplitude probability distribution $apd_1(x_1)$ and the binary code $x_2$ included in the amplitude probability distribution $apd_2(x_2)$ are alternately generated.

Figure 10:
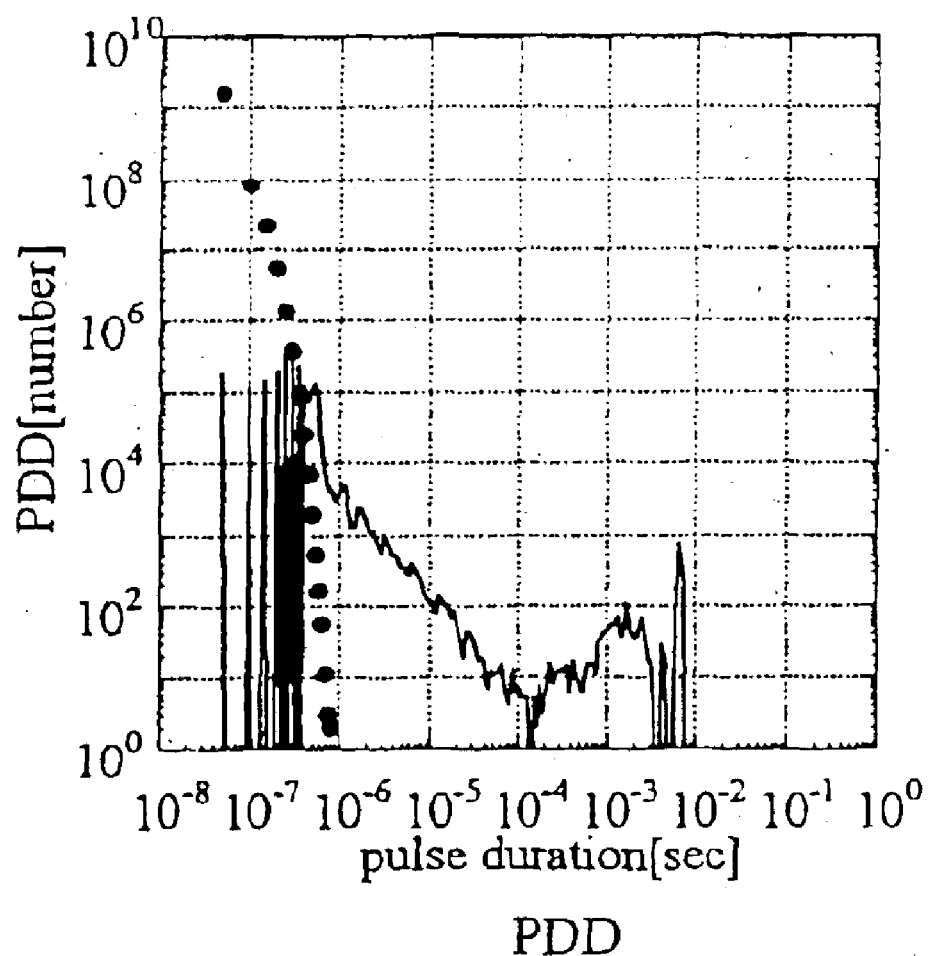
FIG. 10 shows characteristic curves illustrating conventional test results of the Pulse Duration Distribution of electro-magnetic interference waves from electronic Ranges and pseudo noise as to specifying the electro-magnetic interference waves from electronic Ranges and the Amplitude Probability Distribution.
Figure 13:
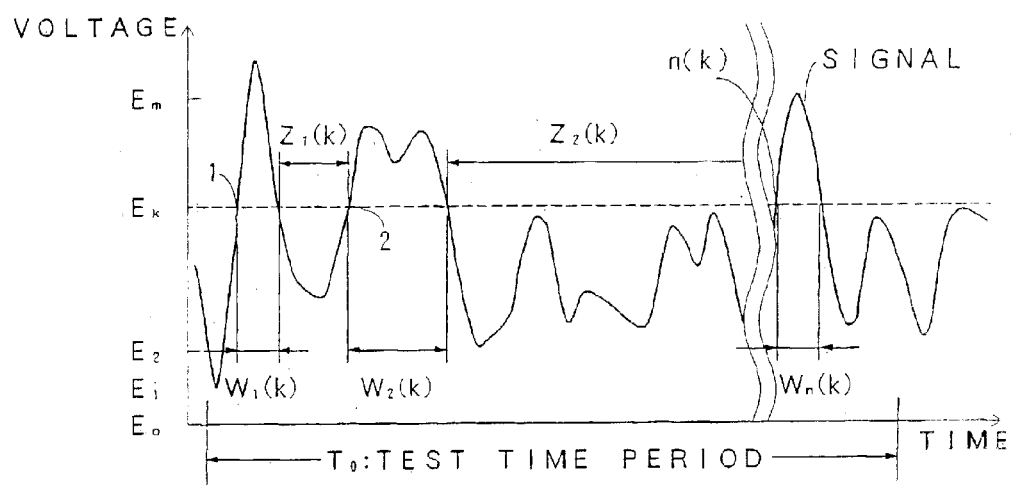
FIG. 13 shows time charts that clarify the technical terms employed in this specification.

The simulation results of pseudo noise generation by a computer according to the method of the present invention will now be described. In this simulation test, the APD, the PDD and the PSD of the electro-magnetic interference waves from an electronic range are measured and adopted. Since the measured value of the APD, the PDD and the PSD are obtained from actual electro-magnetic interference waves, these measured values necessary meet the conditions of equation (1). FIGS. 9A, 9B, 9C and 10 show the simulation results of pseudo noise distributions created by conventional, known devices, where only the electro-magnetic interference waves from an electronic range and the APD are specified. The characteristic curve of the heavy line in FIG. 9A indicates the APD of the electro-magnetic interference waves from an electronic range. This is adopted as the APD by the conventional, known devices. The characteristic curve of the heavy line in FIG. 9B indicates the CRD of the electro-magnetic interference waves from an electronic range, and the characteristic curve of the heavy line in FIG. 9C indicates the PDF of the electro-magnetic interference waves from an electronic range. By using the marks ○, Δ and × in FIGS. 9A, 9B and 9C, the APD, the CRD and the PDF of the pseudo noise are illustrated. In FIG. 10, the PDD of the actual electro-magnetic interference waves and the PDD of the pseudo noise are illustrated with a heavy line and with the mark *, respectively. As understood from FIGS. 9A, 9B, 9C and 10, the actual electro-magnetic interference waves and the pseudo noise substantially agree with each other with respect to the APD and the PDF, but different from each other with respect to the CRD and the PDD.

In contrast, FIGS. 11A, 11B, 11C and show test results of pseudo noise according to the present invention in how they specify the actual electro-magnetic interference waves and the APD, the PDD and the PSD. The heavy line in FIG. 11A indicates the APD of the actual electro-magnetic interference waves. This is employed as a specified value of the APD. The heavy line in FIG. 11B indicates the CRD of the actual electro-magnetic interference waves, while the heavy line in FIG. 11C indicates the PDF of the actual electro-magnetic interference waves. In FIGS. 11A, 11B and 11C, the marks ○, Δ and × indicate the APD, the CR1 and the PDF of the actual electro-magnetic interference waves, respectively. In FIG. 12A, the heavy line indicates the PDD of the actual electro-magnetic interference waves, while the heavy line indicates the PSD of the actual electro-magnetic interference waves. In FIGS. 12A and 12B, the PDD and the PSD of pseudo noise generated in the case of the PDD and the PSD specified are indicated by the marks ○ and ×, respectively. As can be understood from FIG. 11A to FIG. 12B, the actual electro-magnetic interference waves and the pseudo noise are substantially in agreement with each other with respect to the PDD and the PSD, in addition to the APD and PDF, but still different from each other with reference to the CRD.

As discussed above in detail, the noise of non-independent events having a time-correlation of the desired characteristics can be generated in accordance with the present invention, which has a relatively simple construction and control operations. This is done by designating the amplitude probability distribution apd(x), the pulse distribution $pdd_1(i_1)$ and the pulse spacing distribution $psd(i_2)$. Therefore, the merits of the present invention make it very effective for evaluating the immunity of electrical devices to electro-magnetic waves.

What we claim is:

1. A pseudo noise generator comprising:
   a first arbitary random number generator for generating two groups of first random number signals respectively corresponding to pre-divided Amplitude Probability Distributions, which are obtained by pre-dividing a specified Amplitude Probability Distribution into two parts at a specified level;
   a second arbitrary random number generator for generating two groups of second random number signals respectively defined by a specified Pulse Duration Distribution and a specified Pulse Spacing Distribution at said specified level;
   control means for selecting alternately one group or the other group of said two groups of first random number signals by the use of a memory selection signal obtained in accordance with said specified Pulse Duration Distribution and said specified Pulse Spacing Distribution defined at said specified level to obtain selected signals; and
   a D/A converter for converting the selected signals to pseudo continuous noise of analog value; said pseudo continuous noise being generated in accordance with said Amplitude Probability Distribution, and said specified Pulse Duration Distribution and said specified Pulse Spacing Distribution at said specified level.

2. A pseudo noise generator comprising:
   first terminal means receiving first clock pulses;
   a controller for generating, in addition to a memory selection signal, second clock pulses counted down by one forth from said first clock pulses;
   a first arbitrary random number generator for generating, under control with said first clock pulses and said memory selection signal, two groups of first random number signals respectively corresponding to pre-divided Amplitude Probability Distributions, which are obtained by pre-dividing a specified Amplitude Probability Distribution into two parts at a specified level;
   a second arbitrary random number generator for generating, under control of said second clock pulses and said memory selection signal, two groups of second random number signals respectively defined by a specified Pulse Duration Distribution and a specified Pulse Spacing Distribution at said specified level;
   said controller controlling said first arbitrary random number generator to selecting alternately one group or the other group of said two groups of first random number signals by said memory selection signal obtained in accordance with said specified Pulse Duration Distribution and said specified Pulse Spacing Distribution defined at said specified level to obtain selected signals; and
   a D/A converter for converting the selected signals to pseudo continuous noise of analog value; said pseudo continuous noise being generated in accordance with said Amplitude Probability Distribution, and said specified Pulse Duration Distribution and said specified Pulse Spacing Distribution at said specified level.

3. A pseudo noise generator comprising:
   first terminal means receiving first clock pulses;
   a controller for generating, in addition to a memory selection signal, second clock pulses counted down by one forth from said first clock pulses;
   a first arbitrary random number generator for generating under control with said first clock pulses and said memory selection signal, two groups of first random number signals respectively corresponding to pre-divided Amplitude Probability Distributions, which are obtained by pre-dividing a specified Amplitude Probability Distribution into two parts at a specified level;
   a second arbitrary random number generator for generating, under control of said second clock pulses and said memory selection signal, two groups of second random number signals respectively defined by a specified Pulse Duration Distribution and a specified Pulse Spacing Distribution at said specified level;
   said controller controlling said first arbitrary random number generator by said selection signal to selecting alternately one group or the other group of said two groups of first random number signals by said memory selection signal obtained in accordance with said specified Pulse Duration Distribution and said specified Pulse Spacing Distribution defined at said specified level to obtain selected signals;
   a D/A converter for converting the selected signals to pseudo noise of analog value said pseudo noise being generated in accordance with said Amplitude Probability Distribution, and said specified Pulse Duration Distribution and said specified Pulse Spacing Distribution at said specified level, and
   said first arbitrary random number generator comprising eight stages connected successively in cascade, each of stages comprising a cascade connection of a bit generator and a latch circuits, said eight stages being controlled by said first clock pulses, said memory selection signal being applied to a first stage of said eight stages, said first random number signals being obtained from the last stage of said eight stages.

4. A pseudo noise generator according to claim 3, wherein:

said bit generator comprises a uniform random number generator for generating uniform random numbers z controlled under said first clock pulses, a memory for storing data necessary to determine each bit y of said random number signals to be generated, and a comparator for generating the state "1"or the state "0" in accordance with comparison results I(where y<z) and II (where y≧z) respectively.

5. A pseudo noise generator comprising:

first terminal means receiving first clock pulses;

a controller for generating, in addition to a memory selection signal, second clock pulses counted down by one forth from said first clock pulses;

a first arbitrary random number generator for generating, under control with said first clock pulses and said memory selection signal, two groups of first random number signals respectively corresponding to pre-divided Amplitude Probability Distributions, which are obtained by pre-dividing a specified Amplitude Probability Distribution into two parts at a specified level;

a second arbitrary random number generator for generating, under control of said second clock pulses and said selection signal, two groups of second random number signals respectively defined by a specified Pulse Duration Distribution and a specified Pulse Spacing Distribution at said specified level;

said controller controlling said first arbitrary random number generator by said selection signal to selecting alternately one group or the other groups of said two groups of first random number signals by said memory selection signal obtained in accordance with said specified Pulse Duration Distribution and said specified Pulse Spacing Distribution defined at said specified level to obtain selected signals;

a D/A converter for converting the selected signals to pseudo continuous noise of analog value; said pseudo continuous noise being generated in accordance with said Amplitude Probability Distribution, and said specified Pulse Duration Distribution and said specified Pulse Spacing Distribution at said specified level, and said second arbitrary random number generator comprising eight stages connected successively in cascade, each of stages comprising a cascade connection of a bit generator and a latch circuits, said eight stages being controlled by said second clock pulses, said memory selection signal being applied to a first stage of said eight stages, said second random number signals being obtained from the last stage of said eight stages.

6. A pseudo noise generator according to claim 5, wherein:

said bit generator comprises a uniform random number generator for generating uniform random numbers z controlled under said first clock pulses, a memory for storing data necessary to determine each bit y of said random number signals to be generated, and a comparator for generating the state "1"or the state "0" in accordance with comparison results I(where y<z) and II (where y≧z) respectively.

7. A pseudo noise generator comprising:

first terminal means receiving first clock pulses;

a controller for generating, in addition to a memory selection signal, second clock pulses counted down by one forth from said first clock pulses;

a first arbitrary random number generator for generating, under control with said first clock pulses and said memory selection signal, two groups of first random number signals respectively corresponding to pre-divided Amplitude Probability Distributions, which are obtained by pre-dividing a specified Amplitude Probability Distribution into two parts at a specified level;

a second arbitrary random number generator for generating, under control of said second clock pulses and said memory selection signal, two groups of second random number signals respectively defined be a specified Pulse Duration Distribution and a specified Pulse Spacing Distribution at said specified level;

said controller controlling said first arbitrary random number generator by said selection signal to selecting alternately one group or the other group of said two groups of first random number signals by said memory selection signal obtained in accordance with said specified Pulse Duration Distribution and said specified Pulse Spacing Distribution defined at said specified level to obtain selected signals;

a D/A converter for converting the selected signals to pseudo continuous noise of analog value; said pseudo continuous noise being generated in accordance with said Amplitude Probability Distribution, and said specified Pulse Duration Distribution and said specified Pulse Spacing Distribution at said specified level, and said controller comprising an I-T converter for converting said second arbitrary random numbers i to time length data T*, a down counter counting said time length data T* under control of said first clock pulses, a clock generator for generating said second clock pulses from the counting state of said down counter under control of said first clock pulses, and a signal generator for generating said selection signal from the counting state of said down counter under control of said first clock pulses.

* * * * *